United States Patent [19]

Strämke

[11] Patent Number: 4,645,981
[45] Date of Patent: Feb. 24, 1987

[54] PROCESS AND APPARATUS FOR THE SURFACE TREATMENT OF WORKPIECES BY GLOW DISCHARGE

[76] Inventor: Siegfried Strämke, Fichtenhain 6, D-5135 Selfkant 4, Fed. Rep. of Germany

[21] Appl. No.: 620,919

[22] Filed: Jun. 15, 1984

[30] Foreign Application Priority Data

Jun. 22, 1983 [DE]  Fed. Rep. of Germany ....... 3322341

[51] Int. Cl.⁴ ............ H05B 37/00; H05B 39/00; H05B 41/14
[52] U.S. Cl. .................. 315/227 R; 313/17; 313/20; 313/619; 204/178; 219/383; 315/175; 315/240; 315/245; 315/172
[58] Field of Search ......... 315/176, 172, 175, 240, 315/238, 227, 245, 237, 353, 119; 219/383; 204/178; 313/17, 20, 619

[56] References Cited

U.S. PATENT DOCUMENTS

| | | | |
|---|---|---|---|
| 2,789,242 | 4/1957 | Friedman et al. | 313/17 |
| 2,951,969 | 9/1960 | Matulaitis et al. | 315/176 X |
| 3,365,612 | 1/1968 | Schierholt | 315/176 X |
| 3,376,470 | 4/1968 | Stone et al. | 315/176 X |
| 3,483,374 | 12/1969 | Erben | 219/383 X |
| 3,504,154 | 3/1970 | Marcolini | 315/176 X |
| 3,955,118 | 5/1976 | Flemming | 315/116 |

FOREIGN PATENT DOCUMENTS 53-15720  5/1978  Japan ................... 219/383

*Primary Examiner*—Saxfield Chatmon
*Attorney, Agent, or Firm*—Spensley Horn Jubas & Lubitz

[57] ABSTRACT

For the glow discharge between a receptacle and a workpiece, the glow discharge path is connected in series with a first switch. A capacitor circuit is charged via the glow discharge path and two diodes. By closing a switch, the previously positive pole of the capacitor circuit is set to the zero potential, whereby the potential of the other pole is shifted negative. By closing a switch, the capacitor circuit is discharged through the glow discharge path while the first switch is closed. Upon the discharging of the capacitor circuit, the supply voltage continues to be present at the glow discharge path for the remaining pulse time. In the initial range, the voltage pulses have a pulse peak for ignition followed by a maintenance range, the height of which corresponds to the supply voltage.

16 Claims, 5 Drawing Figures

PROCESS AND APPARATUS FOR THE SURFACE TREATMENT OF WORKPIECES BY GLOW DISCHARGE

BACKGROUND OF THE INVENTION

1. Field of the Invention

The invention relates to a process for surface treatment of workpieces by glow discharge by providing voltage pulses for igniting and maintaining a glow discharge between a workpiece disposed in a receptacle and a counterelectrode.

2. Prior Art

It has been known to treat workpiece surfaces by glow discharge, thus exposing, for instance, metallic workpieces to surface transformation by nitration, etc. It is also possible to use glow discharge for coating, tempering, annealing, etc. Usually, the workpiece is used as the cathode and the walls of a vacuum vessel surrounding the workpiece as a counterelectrode, these electrodes being connected to a voltage source of some 100 to 1000 volts during the glow discharge, which extends over the total workpiece surface to be treated. The so-called active species which result in the desired surface modification are created thereby. The glow discharge is normally fed by direct current.

On the one hand, the voltage for glow discharge must be high enough to cover the total workpiece surface to be treated (complete glowing), while it must not be so high as to cause an arc discharge, as this would involve the risk of damage to the workpiece. If direct current voltage is continuously supplied for the glow discharge, it will be difficult to maintain the glow conditions. As a rule, use is made of a rapid disconnecting device which, in case of an arc discharge, will cause a short circuit to protect the workpiece accordingly. If direct current is used to feed the discharge, the temperature existing at the workpiece is particularly dependent upon voltage, pressure and gas type. This is a basic disadvantage because pressure and temperature, above all, should be decoupled for reasons relating to the process technique. On the other hand, workpiece temperature has an influence on the transition from glow discharge to arc discharge.

It has been known to feed the glow discharge with square-topped pulses having a variable pulse duty factor in order to decouple the process parameters and avoid the risk of arc discharges. If the pulse intervals are too long, reignition problems will occur, the pulse voltage sufficient to maintain an ignited glow discharge being sometimes not capable of causing the repeated ignition. Moreover, in the known processes, switching losses are high because the connecting and disconnecting operations are taking place during current flow. Therefore, the pulse processes have not been successful to date.

SUMMARY OF THE INVENTION

It is the object of the invention to provide a process of the type mentioned above by which arc discharges and workpiece damage are avoided, on the one hand, while reignition problems do not occur on the other hand. At the same time, the process is well controllable with a high degree of efficiency.

To solve the problems referred to, the invention provides that, in the initial range, each voltage pulse has a pulse peak for igniting the glow discharge while subsequently the voltage pulse has a range of amplitudes suitable for maintaining the glow discharge.

The initial range of each pulse, according to the process of the invention, displays a pulse peak that is higher than the ignition voltage of the glow discharge. After having been ignited with this short-time pulse peak, the glow discharge is maintained during the voltage pulse by a voltage having a lower amplitude. Arc discharges are avoided by said lower voltage being beneath the ignition voltage. The process of the invention permits the realization of varying pulse ratios, it being possible to select very long pulse intervals without reignition problems. Thus, suitable pulse voltages and pulse duty ratios can be selected for each type of treatment and workpiece temperature. The switching is mostly currentless during the on and off operation.

According to a preferred embodiment of the invention, the voltage pulses contain a constant low amplitude section prior to the pulse peak, the voltage pulses not starting directly with the increased pulse peak. The increased pulse peak is generated after a certain delay after the charging current has decayed in preparation therefor. By this means, switching losses are reduced to quite a small amount.

The pulse duty ratio of voltage pulses to pulse intervals is preferably very small and on the order of 1:10 to 1:500.

An apparatus for performing the process of the invention is characterized in that the glow discharge path between a supply voltage is provided to the workpiece and counterelectrode in series with a pulsecontrolled first switch, that a capacitor circuit chargeable via the glow discharge path is placed so that one pole is at a fixed reference potential when the first switch is closed and its other pole takes a potential situated outside the range of the supply voltage, and that the capacitor circuit is dischargeable via the glow discharge path through a second switch when the second switch is closed. As a result, after termination of a voltage pulse, the capacitor circuit is charged via the glow discharge path. Current is taken from the capacitor circuit through the first switch so that the losses caused by disconnection are very low.

When the first switch is closed, a change of potential occurs at the capacitor circuit in that one pole of the capacitor is connected to one pole of the supply voltage, the capacitor voltage being added to the supply voltage.

The capacitor circuit is subsequently discharged by closing the second switch at a certain time interval after closing of the first switch, the workpiece being temporarily exposed to a voltage higher than the supply voltage by the amount of the charging voltage of the capacitor circuit. Upon discharge of the capacitor circuit, the second switch can be opened again while the glow discharge is maintained by the supply voltage applied to the glow discharge path. The voltage pulse is terminated by opening the first switch.

In a very simple design, the capacitor circuit consists of one capacitor or of a plurality of capacitors connected in parallel. Upon closing the first switch, this capacitor circuit is charged to the full supply voltage. In other words, the amplitude of the pulse peak is nearly twice as high as the supply voltage. However, such a high pulse peak is undesirable in some cases. To generate lower pulse peaks, a preferred further embodiment of the invention comprises a capacitor circuit having a plurality of capacitors which are so coupled via diodes that they are connected in series during charging and in parallel upon the closing of the first and second switches when they are discharged through the glow discharge path. If the individual capacitors are similar to one another, each capacitor of the capacitor circuit is charged to the value $U_V/N$, where $U_V$ is the supply voltage and N is the number of capacitors. The pulse peak above the supply voltage is smaller by a factor $1/N$ than the supply voltage. It is possible accordingly to influence the size of the pulse peak by the number of capacitors.

In case of short pulse intervals, the capacitor circuit is not fully charged via the glow discharge path until the next pulse is ignited. Therefore, the amplitude of the pulse peak of the next pulse is approximately proportional to the time of the pulse interval. This is a desirable effect because with voltage pulses of a short-pulse interval, peak pulses required for the ignition of the glow discharge are less than those required with long pulse intervals.

With the method of the invention, novel plasma processes are feasible which, however, call for treating vessels other than those used previously. In fact, the conventional receptacles cannot be insulated thermally, or can be so-insulated only to a negligible extent. This is because, for physical reasons, a minimum power input, subject to the type of gas and pressure, is required per workpiece area for the glow coating necessary for the treatment. In some plasma processes, condensates occurring at the cold surfaces may inhibit the provided treatment. According to a preferred embodiment of the invention, the receptacle consists of a closed vessel provided with a heating means and surrounded at variable radial distance by a heat-insulating jacket so that the space between the vessel and the jacket can be traversed by a cooling means. By conveniently selecting the flow of the cooling means and the heating, the wall of the vessel may be kept at the temperature required for the process. Preferably, the jacket is divided into several segments quickly removable so that, upon termination of the process, a rapid cooling of the workpiece is possible.

Some embodiments of the invention will be explained hereunder with reference to the drawings.

DESCRIPTION OF PREFERRED EMBODIMENTS

Figure 1:
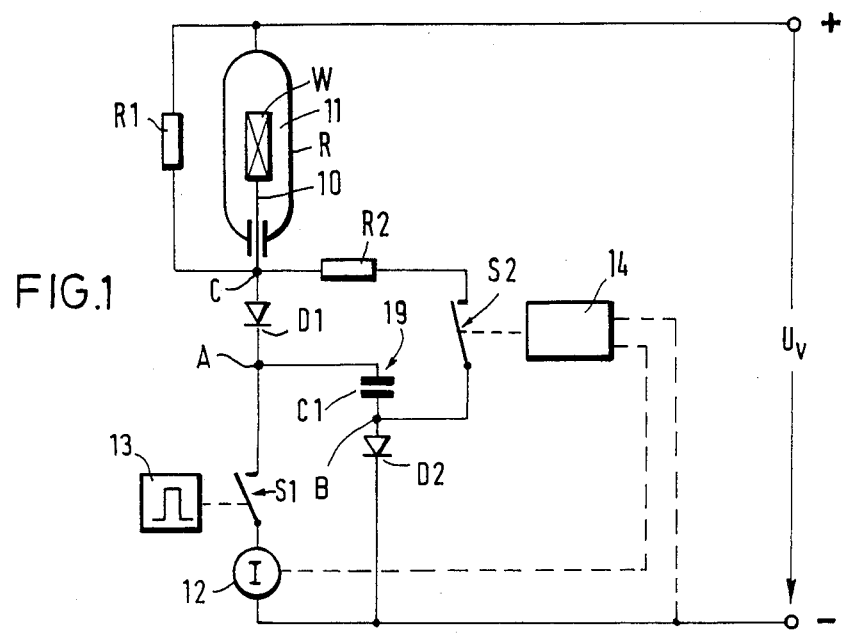
FIG. 1 is a circuit arrangement for performing the process of the present invention.

According to FIG. 1, a receptacle R is provided in which the workpiece W to be treated is connected to an electrode 10 while the receptacle R itself forms the counterelectrode, the space between the workpiece W and the receptacle R forming the glow discharge path 11.

The counterelectrode is connected to the positive pole of the supply voltage $U_V$ and to one end of a resistor R1, the other end of which is connected to the electrode 10 which is connected to the anode of a diode D1 whose cathode is connected via a switch S and a current sensor 12 to the negative pole of the supply voltage $U_V$.

From the connecting point A between the cathode of the diode D1 and the switch S2, a series circuit comprising a capacitor C1 and a diode D2 extends to the negative pole of the supply voltage $U_V$. The connecting point between the capacitor C1 and the anode of the diode D2 is designated as point B.

From point B, a conduit extends via the second switch S2 and a resistor R2 to the electrode 10 or to point C.

To simplify the illustration, switches S1 and S2 are of the mechanical type. However, it is more convenient to use electronic switches, for example, transistors or thyristors.

Switch S1 is controlled by a timed pulse generator 13 while switch S2 is controlled by a control circuit 14 responsive to the current of the current sensor 12, to the voltage at C1, and the time.

Figure 2:
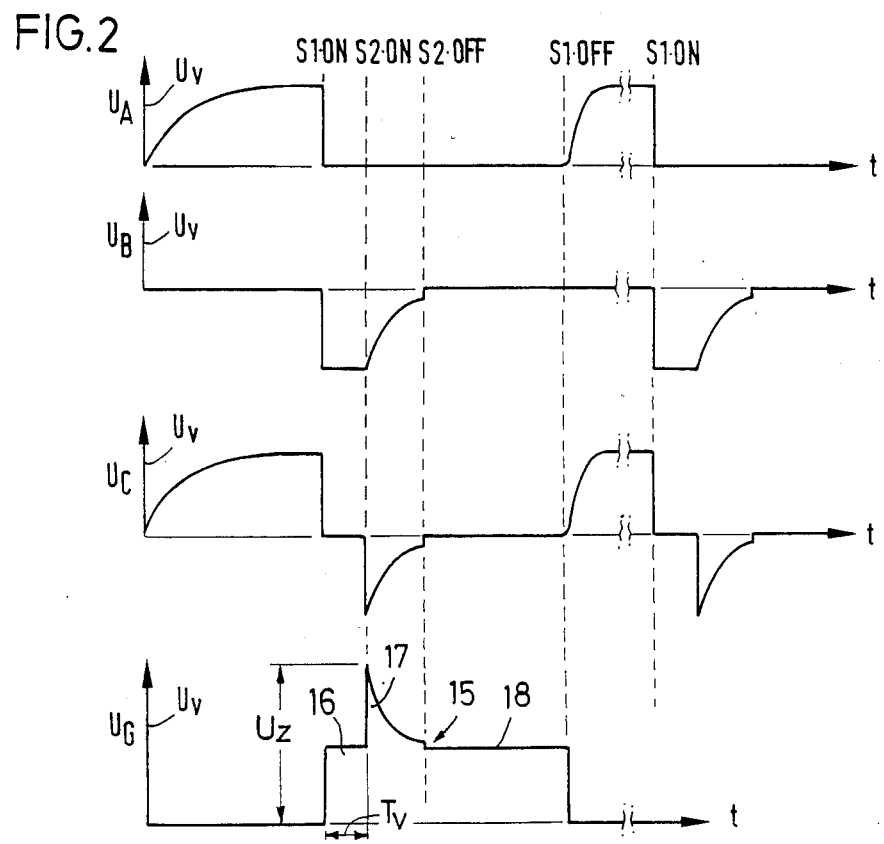
FIG. 2 shows voltage diagrams at different points of the circuit of FIG. 1.

FIG. 2 illustrates the voltages $U_A$, $U_B$ and $U_C$ at points A, B and C of the circuit of FIG. 1. In addition, voltage $U_G$ realized at the glow discharge path 11 is shown. Upon connection of the supply voltage $U_V$, the capacitor C1 is charged through resistor R1, diode D1 and diode D2. As a result, voltages $U_A$ and $U_C$ are developed at points A and C, respectively. In FIG. 2, the minus potential of the supply voltage $U_V$ is considered as a zero potential. The lower plate of capacitor C1 being by nearly the factor $U_V$ more negative than the upper plate, a potential more negative than the zero potential by this factor is formed at point B. At this moment (S1 on), the voltage $U_A$ goes to zero.

The control circuit 14 contains a delay circuit which, after some short time when the current through the current sensor 11 has exceeded a threshold value, becomes responsive and closes switch S2 (S2 on). As a result, the capacitor C1 is discharged via the closed switch S2, the resistor R2 and the glow discharge path 11. Moreover, in accordance with an e-function, the voltage $U_B$ is slowly reduced to zero, while voltage $U_C$ is suddenly negative to subsequently slowly rise to zero. After a predetermined time period, the control circuit 14 again opens switch S2 (S2 off), thus placing point C at zero potential so that the supply voltage $U_V$ is again present at the glow discharge path 11.

If the switch S1 is then opened again by the pulse generator 13 (S1 off), the capacitor C1 is recharged via the glow discharge path 11, the parallel-connected resistor R1 and the diode D1. However, the resistance of the glow discharge path is considerably less than the value of resistor R1 thus permitting a charging that is quicker than the initial charging upon the connection of the supply voltage $U_V$.

The curve of the voltage pulse 15 occurring at the glow discharge path 11 is shown in the last line of FIG. 2. First, the voltage pulse 15 displays a stepped range 16 in which the value of the supply voltage $U_V$ is reached. The time $T_V$ of range 16 is predetermined by the control device 14. Range 16 is followed by the pulse peak 17 having a peak value corresponding to the ignition voltage $U_Z$ nearly twice as high as the supply voltage $U_V$.

From the short time pulse peak 17, the voltage drops according to an e-function to the range 18 which maintains the glow discharge. The range 18 corresponds to the value of $U_V$. The voltage pulse is terminated with the opening of switch S1.

Figure 3:
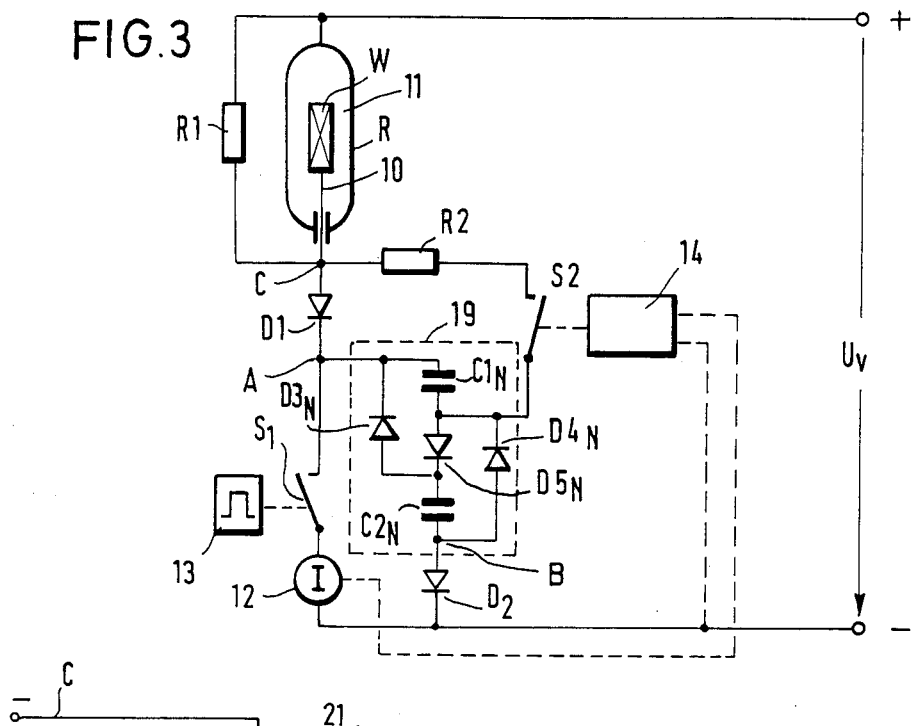
FIG. 3 is another embodiment of a circuit for performing the process of the present invention.

The embodiment of FIG. 3 is different only from that of FIG. 1 in that the sole capacitor C1 is replaced by the capacitor circuit 19 consisting of two capacitors $C1_N$ and $C2_N$ which are coupled by diodes, one pole of capacitor $C1_N$ being connected to point A, the other pole being connected to the anode of diode $D5_N$. The series circuit of the capacitor $C1_N$ and the diode $D5_N$ are bridged by diode $D3_N$, the anode of which is connected to the cathode of diode $D5_N$ and the cathode of which is connected to point A. The cathode of diode $D5_N$ is connected to one pole of capacitor $C2_N$ whose other pole is joined to the anode of diode D2. The anode of diode D2 is connected to the anode of a diode $D4_N$ whose cathode is connected to the anode of diode $D5_N$ and to switch S2.

Figure 4:
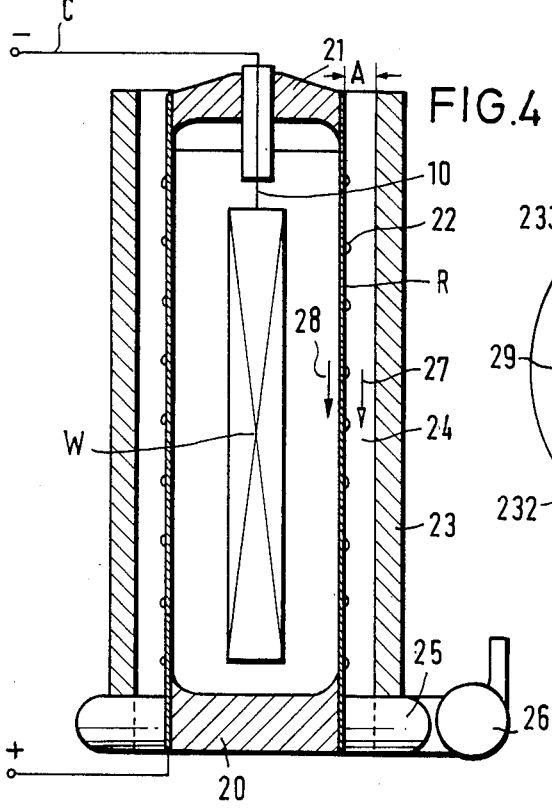
FIG. 4 is a schematic longitudinal section of a treating vessel.
Figure 5:
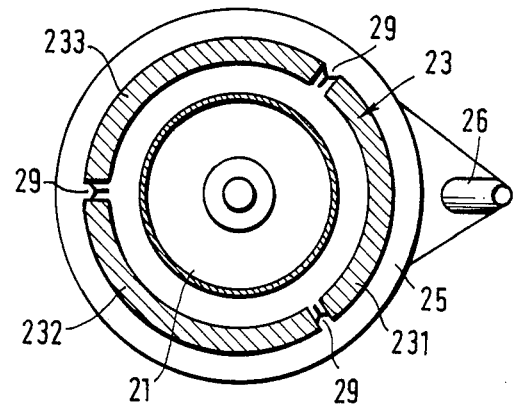
FIG. 5 is a plan view of FIG. 4.

Prior to the closing of switch S1, the capacitors $C1_N$ and $C2_N$ form a series connection, both capacitors being equal to one another. Each is charged to half the supply voltage $U_V/2$ by the diodes $D5_N$ and D2 operated in forward direction. Upon the closing of the switches S1 and S2, the diodes $D5_N$ and D2 are operated in blocking direction, while diodes $D3_N$ and $D4_N$ are operated in a forward direction. Accordingly, the capacitors $C1_N$ and $C2_N$ are operated in a parallel circuit so as to be discharged. As a result, the voltage peak 17 shown in FIG. 3 is only half as high (above the voltage level $U_V$) as that in the embodiment of FIG. 1. The circuit of FIG. 3 is selected if the desired value of the voltage peak 17 is to be lower. In place of two capacitors $C1_N$ and $C2_N$ use can be made also of three or more capacitors which are connected in series for charging and in parallel for discharging. If so, the height of the voltage peak would be reduced even more than that. The treating vessel shown in FIGS. 4 and 5 is used in association with the circuit of FIG. 1 or FIG. 3. It comprises a tubular receptacle R for arranging the workpiece W in contact with line 10. Receptacle R, having a thermally insulated bottom 20, is closed with a cover 21, also thermally insulated. A heating coil 22 is wound about the receptacle R so as to obtain by externally applied heat a specific temperature at the workpiece W, the energy required for this effect being applied by the heating coil 22, i.e., by external separate heating.

The receptable R is enclosed at a variable radial distance designated "A" by a heat-insulating jacket 23 which is open at the top. A cooling means, e.g., air, is absorbed downwardly through the annular space 24 between the receptacle R and the jacket 23. The distance between the insulating jacket and the container wall is variable so that it can be adjusted to obtain the desired annular gap width. During heating, the insulation adjoins the container. With forced cooling, the cooling medium is absorbed at high speed through the annular gap, the absorption being achieved by an annular channel 25 arranged at the lower end of the treating vessel and communicating with a blower 26 that causes a downward cooling air flow (arrow 27) in the annular space 24. Due to said cooling air flow, a convection flow (arrow 28) produced inside the receptacle by heat exchange through the wall, is also directed downwardly. The gas contained inside the receptacle R flows downwardly along the outer wall and upwardly along the workpiece which is uniformly exposed to thermal action.

To permit a quick cooling of the workpiece W upon termination of the glow discharge treatment, the annular jacket 23 is divided into several segments 231, 232, 233 between which the sealing elements 29 are disposed. Said segments may be moved or swivelled individually in radial direction to the outside so that the receptacle R will be freely exposed to quickly cool under the influence of outside air or by blower cooling.

What is claimed is:

1. An apparatus for treating the surfaces of workpieces by applying voltage pulses for igniting and temporarily maintaining a glow discharge between a workpiece disposed in a receptacle and a counterelectrode comprising:
   a first resistor connected across said workpiece and counterelectrode;
   a pulse controllable first switch connected in series with the resistor and with the glow discharge path between the workpiece and the counterelectrode;
   a voltage supply connected across said glow discharge path and said first switch;
   a capacitor circuit having a first pole coupled to said first switch and chargeable from said voltage supply through said first resistor when said first switch is opened;
   a second switch connected in series with the second pole of said capacitor circuit and said glow discharge path, the closing of said first switch followed by the closing of said second switch after said capacitor circuit is charged causing a voltage across said glow discharge path sufficient to ignite said glow discharge.

2. An apparatus as in claim 1 further comprising:
   a first diode connected in series with said glow discharge path and said first switch;
   a second diode connected in series with the second pole of said capacitor circuit so that the series combination of said second diode and said capacitor circuit is in parallel with said first switch, said second diode permitting said capacitor circuit to be charged from said voltage supply through said first resistor when said first switch is opened and preventing said capacitor from being discharged through said first switch when said first switch is closed before said second switch is closed; and
   a second resistor connected between said second switch and said glow discharge patch.

3. An apparatus as in claim 2 further comprising:
   a clocking means for controlling said first switch; and
   a control means for controlling said second switch.

4. An apparatus as in claim 3 wherein said control means is responsive to current flowing through said first switch.

5. An apparatus as in claim 3 wherein said control means is a clocking means.

6. An apparatus as in claim 3 wherein said control means is responsive to the voltage at one pole of said capacitor circuit.

7. An apparatus as in claim 3 wherein said capacitor circuit comprises:
   a plurality of capacitors; and
   a plurality of diodes, said capacitors and said diodes coupled so that said capacitors are connected in series during charging when said first switch and said second switch are open and are connected in parallel when said first switch and said second switch are closed.

8. An apparatus as in claim 2 wherein the resistance of said second resistor is considerably larger than the resistance of the glow discharge path.

9. An apparatus as in claim 2 wherein the receptacle comprises:

a container provided with a heating means and surrounded at a variable radial distance by a heat insulating jacket; and a cooling means for cooling the space between the container and the jacket.

10. An apparatus as in claim 9 wherein said heat insulating jacket is comprised of several segments, said segments being quickly removeable from said container.

11. In a glow discharge device of the type in which a glow discharge is ignited and temporarily maintained along a glow discharge path by the repetitive application of voltage pulses to said device, the improvement comprising a voltage control means for controlling the voltage of said applied voltage pulses so that each of said applied pulses has in its initial portion a portion of relatively higher glow discharge initiating voltage and thereafter a following portion of relatively lower glow discharge maintaining voltage, said voltage control means comprising:

a capacitor circuit coupled at its first pole to said glow discharge path;

a first switch connected in parallel with said capacitor circuit for enabling said capacitor circuit to be charged when said switch is opened;

a second switch coupling said capacitor circuit and said glow discharge path for enabling the voltage on said first pole of said capacitor circuit to be applied through said second switch to said glow discharge path when said second switch is closed;

means coupling said capacitor circuit and said first switch, for preventing said capacitor circuit from being discharged through said first switch when said first switch is closed and said second switch is open while permitting said capacitor circuit to be charged when said first switch is open; and means for controlling said first and second switches so that prior to each voltage pulse said first and second switches are initially opened enabling said capacitor circuit to be charged and thereafter closed with the first switch closed slightly prior to the second switch whereby a portion of relatively higher glow discharge initiating voltage is generated in each pulse when said second switch is closed.

12. An improved glow discharge device as in claim 11 wherein said means coupling said capacitor circuit and said first switch is a first diode and further comprising:

a second diode in series with said capacitor circuit through which said capacitor circuit is charged, the series combination of said first diode and said capacitor circuit being connected in parallel combination with said first switch, said second diode being connected between said parallel combination and said glow discharge path.

13. An improved glow discharge device as in claim 12 wherein said capacitor circuit comprises:

a plurality of capacitors; and a plurality of diodes coupling said capacitors, said capacitors and said diodes arranged so that said capacitors are connected in series when said first switch is open, enabling said capacitors to be charged, and in parallel when said second switch is closed.

14. In a glow discharge device of the type in which the glow discharge is ignited and temporarily maintained along a glow discharge path between a workpiece and a receptacle holding said workpiece by the repetitive application of voltage pulses to said device, the improvement comprising:

a heating coil wound externally about the receptacle for heating said workpiece externally; and a heat insulating jacket surrounding said receptacle about which said heating coil is wound, said jacket movable toward and away from said receptacle so as to form an annular space open at one end when said jacket is moved away from said receptacle, said jacket provided with a means for moving a cooling medium through said annular space.

15. In a glow discharge device of the type in which a glow discharge is ignited and temporarily maintained along a glow discharge path by the repetitive application of voltage pulses to said device, the improvement comprising:

voltage control means for controlling the voltage of said applied voltage pulses so that each of said applied pulses has in its initial portion a portion of relatively higher glow discharge initiating voltage and thereafter a following portion of relatively lower glow discharge maintaining voltage comprising:

a heating coil wrapped about said receptacle;

an adjustable insulating jacket, said jacket placeable against said receptacle where said heating coil is wrapped and adjustably moveable away from said receptacle to leave a gap between said receptacle and said jacket; and means for moving a cooling medium through said gap.

16. An improved glow discharge device as in claim 15 wherein said receptacle is essentially cylindrical in shape and said workpiece is located in the area about the axis of said cylindrically shaped receptacle and wherein said means for moving said cooling medium causes said cooling medium to move in said gap in the direction of said axis, thereby inducing a convection flow in said receptacle.

* * * * *